(12) United States Patent
Bahl et al.

(10) Patent No.: US 10,340,252 B2
(45) Date of Patent: *Jul. 2, 2019

(54) HIGH VOLTAGE DEVICE WITH MULTI-ELECTRODE CONTROL

(71) Applicant: Texas Instruments Incorporated, Dallas, TX (US)

(72) Inventors: Sandeep R. Bahl, Palo Alto, CA (US); Michael D. Seeman, Palo Alto, CA (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

This patent is subject to a terminal disclaimer.

(21) Appl. No.: 15/947,227

(22) Filed: Apr. 6, 2018

(65) Prior Publication Data

US 2018/0233481 A1    Aug. 16, 2018

Related U.S. Application Data

(63) Continuation of application No. 14/747,169, filed on Jun. 23, 2015, now Pat. No. 9,991,225.

(51) Int. Cl.
*H01L 29/66* (2006.01)
*H01L 23/00* (2006.01)
(Continued)

(52) U.S. Cl.
CPC .......... *H01L 24/97* (2013.01); *H01L 21/8258* (2013.01); *H01L 24/49* (2013.01);
(Continued)

(58) Field of Classification Search
CPC .......... H01L 29/7787; H01L 29/66462; H01L 29/7782; H01L 29/66431; H01L 29/7786;
(Continued)

(56) References Cited

U.S. PATENT DOCUMENTS 5,473,175 A    12/1995   Nikaido et al.
6,411,554 B1    6/2002   Kawai
(Continued)

FOREIGN PATENT DOCUMENTS

EP          2477220 A3      7/2012
WO      2015073980 A1      5/2015

OTHER PUBLICATIONS

Notification of Transmittal of the International Search Report and the Written Opinion NOF the International D]Searching Authority, or the Declaration, dated Oct. 20, 2016. 7 pages.

*Primary Examiner* — Eric A. Ward
*Assistant Examiner* — Eric K Ashbahian
(74) *Attorney, Agent, or Firm* — Tuenlap Chan; Charles A. Brill; Frank D. Cimino

(57) ABSTRACT

A high-voltage transistor (HVT) structure adapts a low-voltage transistor (LUT) to high-voltage environments. The HVT structure includes a drain node, a source node, a control gate, and a field electrode. The drain node and the source node define a conductive channel, in which mobilized charges are regulated by the control gate. While being isolated from the control gate, the field electrode is configured to spread the mobilized charges in response to a field voltage. The field electrode is structured and routed to prevent charge sharing with any one of the drain node, source node, or control gate. Advantageously, the isolated field electrode minimizes the capacitance of the control gate as well as the drain and source nodes, such that the HVT can switch with less power loss and a more robust performance in a high-voltage environment.

15 Claims, 5 Drawing Sheets

(51) Int. Cl.
| | |
|---|---|
| *H01L 27/085* | (2006.01) |
| *H01L 29/40* | (2006.01) |
| *H01L 29/778* | (2006.01) |
| *H01L 21/8258* | (2006.01) |
| *H01L 27/088* | (2006.01) |
| *H01L 25/065* | (2006.01) |
| *H01L 29/78* | (2006.01) |
| *H01L 29/20* | (2006.01) |

(52) U.S. Cl.
CPC ........ *H01L 25/0655* (2013.01); *H01L 27/085* (2013.01); *H01L 27/088* (2013.01); *H01L 29/404* (2013.01); *H01L 29/7786* (2013.01); H01L 24/16 (2013.01); H01L 24/48 (2013.01); H01L 29/2003 (2013.01); H01L 29/78 (2013.01); H01L 2224/16145 (2013.01); H01L 2224/48137 (2013.01); H01L 2924/00014 (2013.01); H01L 2924/14 (2013.01)

(58) Field of Classification Search
CPC ......... H01L 29/778–7789; H01L 24/97; H01L 24/48; H01L 21/8258; H01L 2924/13064
See application file for complete search history.

(56) References Cited

U.S. PATENT DOCUMENTS

| | | | |
|---|---|---|---|
| 9,991,225 B2 * | 6/2018 | Bahl | ..................... H01L 27/085 |
| 2006/0118809 A1 * | 6/2006 | Parikh | ................... H01L 29/402 |
| | | | 257/103 |
| 2008/0073670 A1 * | 3/2008 | Yang | ..................... H01L 29/404 |
| | | | 257/194 |
| 2012/0049938 A1 | 3/2012 | Ishimori et al. | |
| 2012/0068772 A1 * | 3/2012 | Murad | ................... H01L 29/402 |
| | | | 330/296 |
| 2012/0220089 A1 * | 8/2012 | Imada | ................. H01L 29/0619 |
| | | | 438/270 |
| 2013/0020614 A1 | 1/2013 | Lu et al. | |
| 2013/0075752 A1 * | 3/2013 | Kotani | ............. H01L 29/42316 |
| | | | 257/76 |
| 2013/0141156 A1 | 6/2013 | Teo et al. | |
| 2014/0111268 A1 | 4/2014 | Imada | |
| 2014/0225163 A1 | 8/2014 | Briere | |
| 2015/0102388 A1 | 4/2015 | Simin et al. | |
| 2015/0349771 A1 * | 12/2015 | Liao | ..................... H03K 17/162 |
| | | | 327/382 |

* cited by examiner

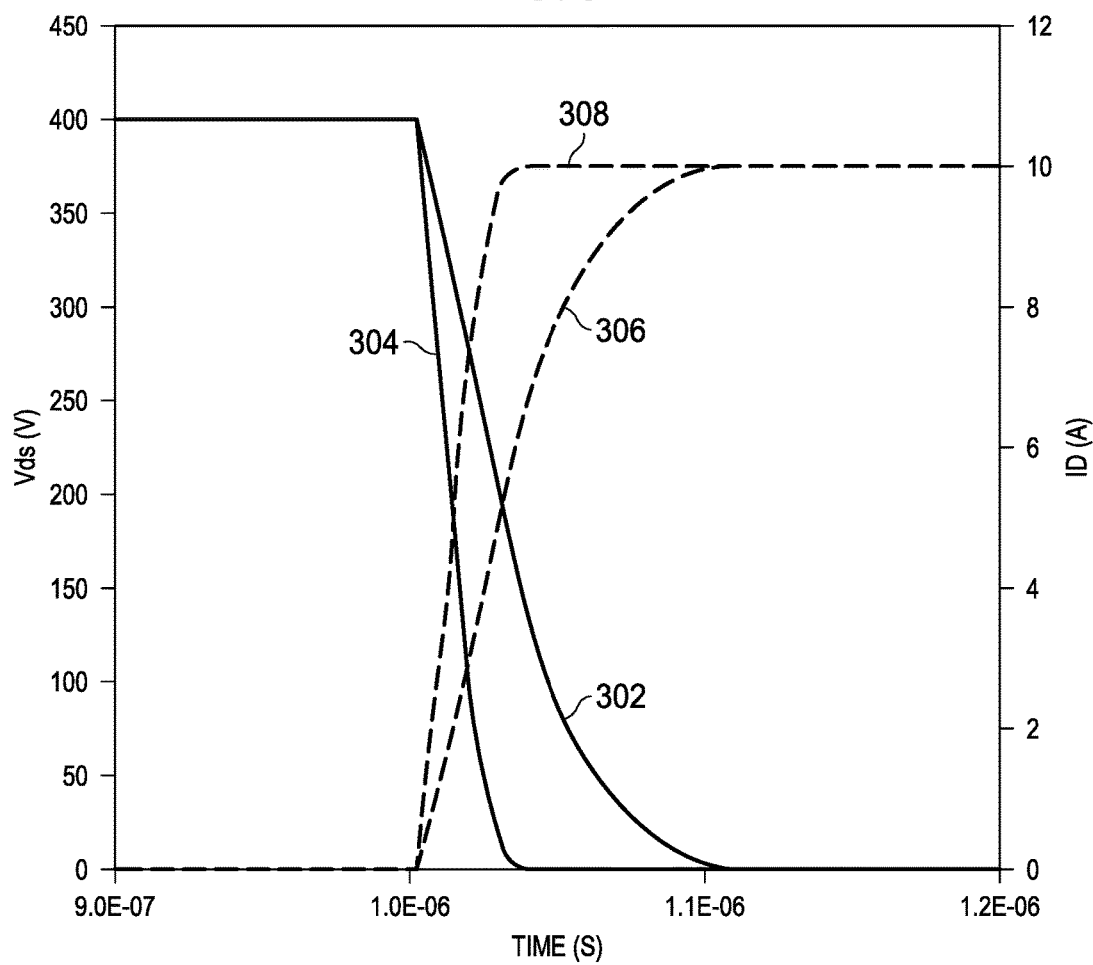

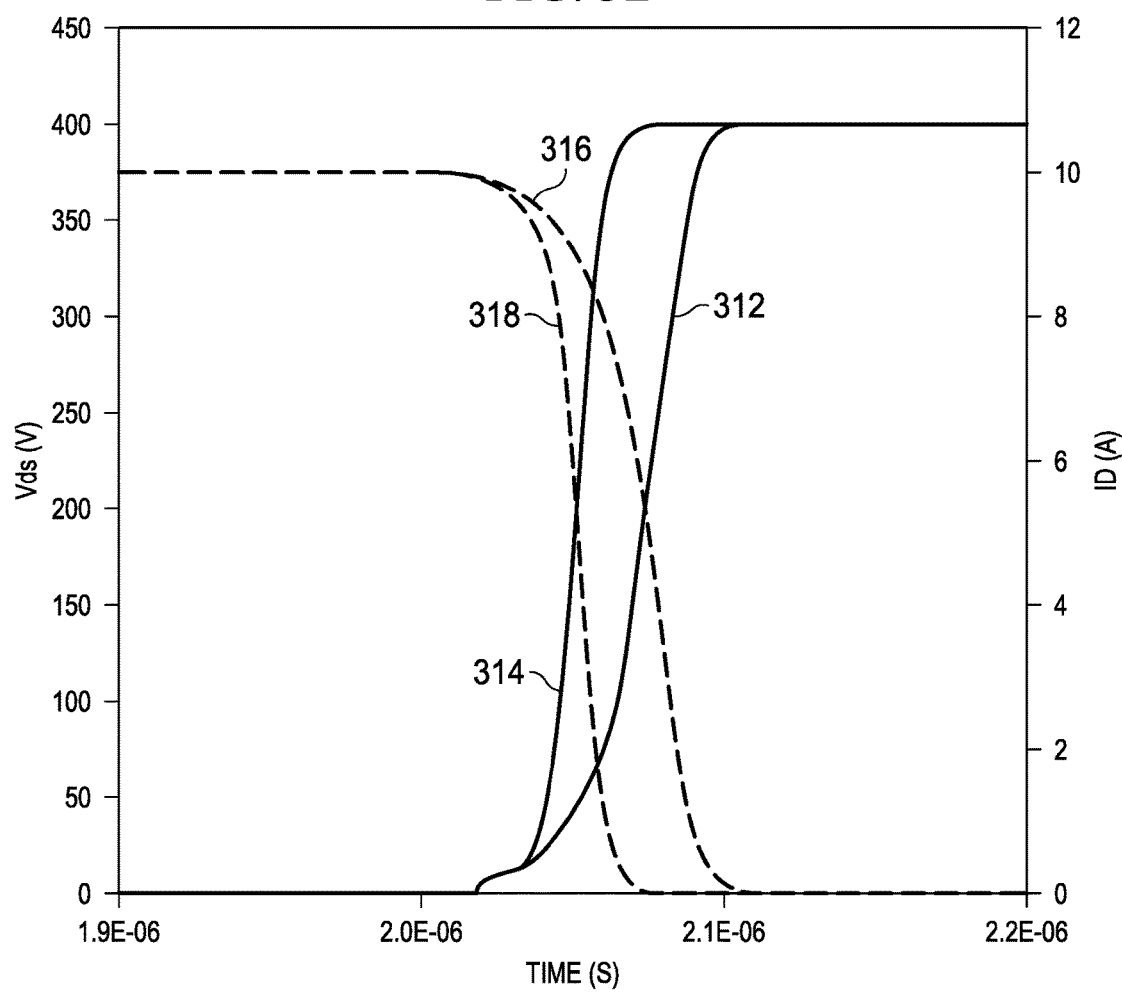

HIGH VOLTAGE DEVICE WITH MULTI-ELECTRODE CONTROL

CROSS-REFERENCE TO RELATED APPLICATIONS

Under 35 U.S.C. § 120, this continuation application claims benefits of and priority to U.S. patent application Ser. No. 14/747,169, filed on Jun. 23, 2015, the entirety of which are hereby incorporated herein by reference.

BACKGROUND

Silicon-based transistors are well suited for low-voltage applications. But in high-voltage applications (e.g., greater than 100 V of supply voltage), the breakdown voltage of a silicon-based transistor increases, thereby causing its channel resistance to go up disproportionately. As a result, there is a large tradeoff in the BV*Ron figure-of-merit. Increasing the breakdown voltage of a silicon-based transistor also increases the transistor's device capacitances significantly, which generally slow down the transistor's switching efficiency.

To address these issues, a high-voltage device may be used in a cascode configuration with a silicon-based transistor. The high-voltage device can be a high electron mobility transistor (HEMT), such as a gallium-nitride (GaN) HEMT. Typically, a GaN HEMT includes a two-dimensional electron gas (2DEG) channel that provides a high breakdown voltage and enables ultra-high-power-density operations with low power loss. During switching operations, however, there may be excessive ringing between the silicon-based transistor and the high-voltage device. In order to suppress the ringing phenomenon, a ringing suppressor can be placed at the control gate of the high-voltage device.

While the ringing suppressor can suppress the ringing phenomenon, it will increase power loss and reduce switching efficiency of the cascode configuration. Thus, there is a need for a high-voltage switch with low power loss and high switching efficiency.

SUMMARY

The present disclosure describes systems and techniques relating to multi-electrode control structures for adapting low-voltage transistors (e.g., Silicon-based field effect transistors) to high-voltage applications. The disclosed multi-electrode control structures have faster turn-on time and turn-off time than their conventional counterparts. As a result, the disclosed multi-electrode control structures can operate under high-voltage with less power loss during switching cycles.

In one implementation, the present disclosure describes a high electron mobility transistor (HEMT) structure that includes a substrate, a 2-dimension electron gas (2DEG) layer, a source node, a control gate, and a field electrode. The substrate can be a layer of silicon, above which the 2DEG layer is disposed. The 2DEG layer has a first end and a second end, both of which extend across a channel region of the HEMT structure. The drain node of the HEMT structure is disposed above the first end of the 2DEG layer, whereas the corresponding source node is disposed above the second end of the 2DEG layer to define a channel with the drain node between the first and second ends of the 2DEG layer. Accordingly, the source node establishes a drain-source capacitance ($C_{DS}$) with the drain node. The control gate of the HEMT structure is disposed above the channel, and it is configured to mobilize charges along the channel in response to a gate-source voltage. The control gate establishes a gate-source capacitance ($C_{GS}$) with the source node, as well as a gate-drain capacitance ($C_{GD}$) with the drain node. The field electrode of the HEMT structure is disposed above the channel, and it is configured to spread the mobilized charges in response to a field voltage. The field electrode is structured and routed to prevent charge sharing with any one of the drain node, source node, or control gate. For instance, the field electrode is structurally and electrically isolated from the control gate, the drain node, and the source node. Advantageously, the field electrode is structured and routed to sustain the capacitances $C_{DS}$, $C_{GD}$, and $C_{GS}$, such that the HEMT structure can switch with less power loss and a more robust performance.

In another implementation, the present disclosure describes a high-voltage switch that includes a high-voltage transistor (HVT) and a low-voltage transistor (LVT) forming a cascode structure with the HVT. The HVT includes a drain node configured to receive a high-voltage source, as well as a source node configured to define a high-voltage channel with the drain node. The HVT also includes a control gate positioned between the drain node and the source node, such that the control gate is configured to regulate the channel. The HVT further includes a field electrode disposed above the channel. Although the field electrode is also configured to reregulate the channel, the field electrode is isolated from the control gate. As such, the field electrode is structured and routed to prevent charge sharing with any one of the drain node, the source node, or the control gate. Advantageously, the high-voltage switch can operate under high-voltage with little power loss and short switching time.

In yet another implementation, the present disclosure describes a high-voltage device that includes a low-voltage transistor (LVT) forming a cascode configuration with a high electron mobility transistor (HEMT). The LVT is formed on a first substrate, and it has a first drain node, a first control gate, and a first source node. The HEMT is formed on a second substrate, which can be a physically separated substrate from the first substrate or a region of a common substrate shared with the first substrate. The HEMT includes a 2-dimension electron gas (2DEG) layer, a second drain node, a second source node, a second control gate, and a field electrode. The 2DEG layer is disposed above the second substrate. The second drain node disposed above the 2DEG layer, and it is configured to receive a high-voltage source. The second source node is disposed above the 2DEG layer, and it is connected with the first drain node of the LVT. The second control gate is disposed above the 2DEG layer, and it is configured to regulate a channel defined jointly by the second drain node, the second source node, and the 2DEG layer. The field electrode is disposed above the channel, and it is configured to distribute charges along the channel. Because the field electrode is free of contact from the second control gate, the second drain node, and the second source node over a region defined by the second substrate, it does not burden the second control gate with additional capacitive load. Advantageously, the high-voltage device can switch under high-voltage with little power loss and short switching time.

The described systems and techniques can be implemented in electronic circuitry, computer hardware, firmware, or in combinations of them, such as the structural means disclosed in this specification and structural equivalents thereof.

Details of one or more implementations of the present disclosure are set forth in the accompanying drawings and the description below. Other features and advantages may be apparent from the description and drawings, and from the claims

DRAWING DESCRIPTIONS

FIG. 3A shows a timing diagram comparing turn-on performances between a conventional high-voltage device and a disclosed high-voltage device according to an aspect of the present disclosure.

FIG. 3B shows a timing diagram comparing turn-off performances between a conventional high-voltage device and a disclosed high-voltage device according to an aspect of the present disclosure.

Like reference symbols in the various drawings indicate like elements.

DETAILED DESCRIPTION

Figure 1:
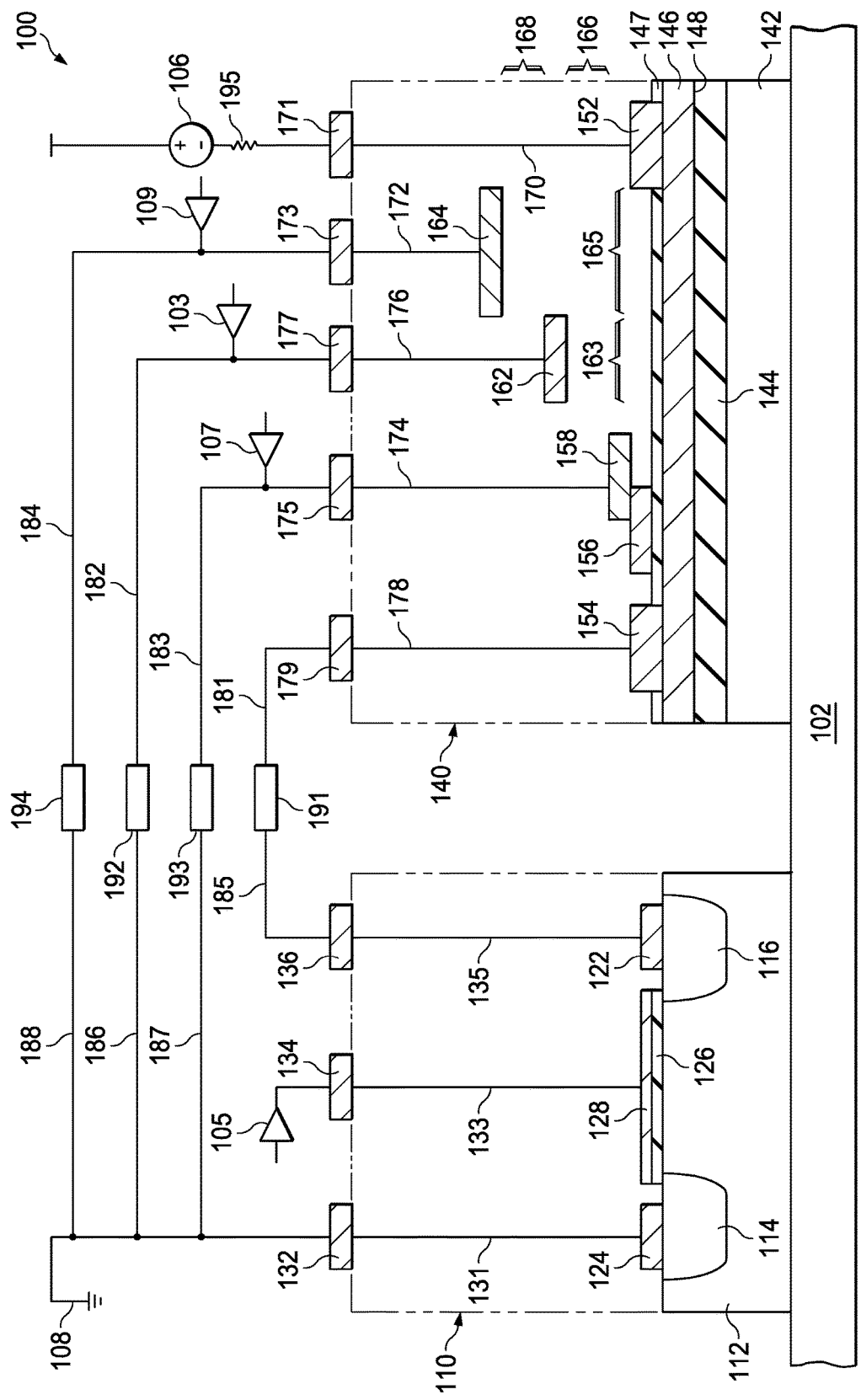
FIG. 1 shows a cross-sectional view of an exemplary high-voltage device formed on two separate substrates according to an aspect of the present disclosure.

FIG. 1 shows a cross-sectional view of an exemplary high-voltage device 100 formed on two separate substrates (e.g., 112 and 142) according to an aspect of the present disclosure. The high-voltage device 100 can be adapted to perform one or more switching functions in a high-voltage environment. Thus, the high-voltage device 100 can be routed and configured as a high-voltage switch. For instance, the high-voltage device (HVD) 100 generally includes a low-voltage transistor (LVT) 110 and a high-voltage transistor (HVT) 140. The LVT 110 and the HVT 140 can be routed in a cascode configuration (as shown in FIG. 1) to transform the HVD 100 into a high-voltage switch.

The LVT 110 is a semiconducting structure formed on a first substrate 112, which can be a silicon-based substrate. The HVT 140 is a semiconducting structure formed on a second substrate 142, which is separated from the first substrate 112 but placed on a common substrate 102 that is shared with the first substrate 112. The common substrate 102 can be a package layer for fitting multiple semiconductor dies. In that case, the LVT 110 belongs to a first integrated circuit (IC) die, whereas the HVT 140 belongs to a second IC die. Accordingly, the connections between the LVT 110 and the HVT 140 are established via bonding pads and bonding wires external to the semiconducting structures from which the LVT 110 and the HVT 140 are formed.

The HVT 140 can be a part of a semiconducting structure that provides high electron mobility. For instance, the HVT 140 can be a high electron mobility transistor (HEMT). The HVT 140 protects the LVT 110 from a high-voltage source 106, which can typically generate a supply voltage exceeding 100 V. Thus, the HVT 140 allows the LVT 110 to perform switching in a high-voltage environment.

The HVT 140 structure includes a 2-dimension electron gas (2DEG) layer 148 disposed above the second substrate 142. The 2DEG layer 148 is formed between a first bandgap layer 144 and a second bandgap layer 146. The first bandgap layer 144 is disposed on top of the second substrate 142, and the second bandgap layer 146 is disposed on top of the first bandgap layer 144. According to an aspect of the present disclosure, the first bandgap layer 144 can be a wide-bandgap channel layer, and the second bandgap layer 146 can be a bandgap layer having a wider bandgap than the first bandgap layer 144. For instance, the first bandgap layer 144 may include gallium nitride (GaN) and/or gallium arsenide (GaAs), and the second bandgap layer 146 may include aluminum gallium nitride (AlGaN) and/or aluminum gallium arsenide (AlGaAs). Together, the first and second bandgap layers 144 and 146 provide a foundation on which the 2DEG layer 148 is developed.

An insulator layer 147 may be disposed above the second bandgap layer 146 for insulating the second bandgap layer 146 from several conducting electrodes (e.g., 152, 154, and 156). The insulator layer 147 includes one or more insulating materials, such as silicon nitride (SiN), silicon dioxide ($SiO_2$), aluminum nitride (AlN), and aluminum dioxide ($AlO_2$). A drain node (a.k.a. drain terminal and drain electrode) 152 is disposed above a first end of the 2DEG layer 148 by etching through the insulator layer 147 and is electrically connected to the 2DEG layer 148 by an alloying treatment. A source node (a.k.a. source terminal and source electrode) 154 is disposed above a second end of the 2DEG layer 148 by etching through the insulator layer 147 and is electrically connected to the 2DEG layer 148 by an alloying treatment. Together, the drain node 152 and the source node 154 define a heterojunction channel between the first and second ends of the 2DEG layer 148. When properly biased, the heterojunction channel carries high mobility electrons to conduct a current from the drain node 152 to the source node 154 given that the high-voltage source 106 provides a sufficiently high drain voltage supply. Thus, the heterojunction channel established on the 2DEG layer 148 can withstand a high voltage source, which can be more than 100V.

A control gate (a.k.a. gate terminal and gate electrode) 156 is disposed above the 2DEG layer 148 and in between the drain and source nodes 152 and 154. In one implementation, the control gate 156 can be placed directly on top of the insulator layer 147. In another implementation, the control gate 156 can be placed directly on top of the second bandgap layer 146. The control gate 156 is configured to regulate the heterojunction channel by manipulating the charge mobility of the channel. In particular, the control gate 156 is configured to mobilize charges along the heterojunction channel upon establishing a sufficiently high gate-to-source voltage ($V_{GS}$). In the event that GaN is included in the first bandgap layer 144, for example, the control gate 156 will start mobilizing charges along the heterojunction channel when $V_{GS}$ increases from −14V to −13V. In this particular configuration, the HVT 140 is a depleted N-device which is nonconductive when $V_{GS}$ is below −14V and becomes conductive when $V_{GS}$ is −13V and above.

The aforementioned conducting electrodes (e.g., 152, 154, and 156) establish parasitic capacitances with one another and through their couplings with the 2DEG layer 148. For instance, the source node 154 establishes a drain-source capacitance ($C_{DS}$) with the drain node 152. Similarly, the control gate 156 establishes a gate-source capacitance ($C_{GS}$) with the source node 154, as well as a gate-drain capacitance ($C_{GD}$) with the drain node 152. These parasitic capacitances directly impact power loss and switching performance of the HVT 140 during one or more switching cycles.

When the drain voltage is raised with the HVT 140 turned off, the mobilized charges in the 2DEG layer can be spread evenly along the channel by using one or more field plates and/or field electrodes. In one implementation, for example, the HVT 140 may include an auxiliary field plate 158 that is formed on top of the control gate 156. The auxiliary field plate 158 contacts the control gate 156 and thus share the same potential as the control gate 156. The auxiliary field plate 158 is configured to spread the mobilized charges around a region adjacent to the control gate 156. Preferably, the control gate 156 is positioned closer to the source node 154 than the auxiliary field plate 158 so as to reduce the device-on-resistance of the HVT 140. Although the auxiliary field plate 158 is formed on top of the control gate 156, the auxiliary field plate 158 extends beyond the control gate 156 over a region that the control gate 158 does not cover. Preferably, this region is positioned closer to the drain node 152 than the control gate 156.

The HVT 140 also includes one or more field electrodes (e.g., 162 and 164) that are structurally and electrically isolated from the control gate 156 and the auxiliary field plate 158, as well as the drain node 152 and source node 154. These field electrodes are disposed above the heterojunction channel, and they are configured to regulate the channel in a manner similar to the auxiliary field plate 158. For example, these field electrodes are configured to receive one or more field voltages for spreading the mobilized charges along the channel over a region that is not covered by the control gate 156 and the auxiliary field plate 158.

The field electrodes are positioned farther away from the 2DEG layer 148 than the control gate 156. In one implementation, for example, the HVT 140 includes a first field electrode 162 and a second field electrode 164, both of which are positioned farther away from the 2DEG layer 148 than the control gate 156. Thus, the first field electrode 162 can be formed on a first dielectric layer 166, which is placed above the control gate 156. Similarly, the second field electrode 164 can be formed on a second dielectric layer 168, which is placed above the control gate 156 and the first dielectric layer 166. Depending on the particular process used for manufacturing the HVT 140, the first and second dielectric layers 166 and 168 may have the same chemical composition.

To reduce power loss and switching time during switching, the field electrodes (e.g., 162 and 164) are structured and routed to prevent charge sharing with any one of the drain node 152, the source node 154, or the control gate 156. To that end, the field electrodes are free of contact from any one of the drain node 152, source node 154, or control gate 154. As a result, the field electrodes sustains the capacitances $C_{DS}$, $C_{GS}$, and $C_{GS}$ by not burdening any of the drain node 152, source node 154, or control gate 154 with additional parasitic capacitance.

The field electrodes are disposed above a region of the heterojunction channel that are not covered by the control gate 156 and the auxiliary field plate 158. This region is adjacent to the drain node 152, such that the field electrodes are configured to spread the mobilized charges between the control gate 156 and the drain node 152. In one implementation, for instance, the first field electrode 162 is disposed above a first region 163 of the channel, and thus the first field electrode 162 is configured to spread mobilized charges in the first region 163. In another implementation, for instance, the second field electrode 164 is disposed above a second region 165 of the channel, and thus the second field electrode 164 is configured to spread mobilized charges in the second region 165. Because the first and second field electrodes 162 and 164 can be separated or connected with each other, the first and second regions 163 and 165 can be two distinctive regions or two partially overlapped regions.

While the HVT 140 protects the LVT 110 in a high-voltage environment, the LVT 110 initiates and controls the switching activities of the HVT 140. According to the configuration as shown in FIG. 1, the LVT 110 can be implemented using an n-channel MOSFET (NMOS). In one implementation, the LVT 110 includes a drain node 122, a source node 124, and a control gate 128. The drain node 122 is disposed above a first n-doped region 116 (a.k.a. drain region), which is formed within the surface of the first substrate 112. The source node 124 is disposed above a second n-doped region 114 (a.k.a. source region), which is also formed within the surface of the first substrate 112. The control gate 128 is disposed on top of a gate oxide layer 126, which is grown on the surface of the first substrate 112. In another implementation, the source node 124 can also be internally connected to the first substrate 112.

To perform the high-voltage switching function, the LVT 110 and the HVT 140 are coupled with each other in a cascode configuration. More specifically, the source node 124 of the LVT 110 (or the first source node) is coupled with a low-voltage source 108 for receiving a source voltage, the drain node 122 of the LVT 110 (or the first drain node) is coupled with the source node 154 of the HVT 140 (or the second source node), and the drain node 152 of the HVT 140 (or the second drain node) is coupled with the high-voltage source 106. Upon receiving an input switching voltage, the control gate 128 of the LVT 110 (or the first control gate) asserts an electric field over a region in the first substrate 112 to create an n-channel between the drain node 122 and the source node 124. When the difference between the input switching voltage and the source voltage overcomes the threshold voltage of the LVT 110, the n-channel becomes conductive such that current flows from the drain node 122 to the source node 124.

Meanwhile, the control gate 156 of the HVT 140 (or the second control gate) is coupled with the low-voltage source 108 for receiving the same source voltage as the source node 124. Thus, as the potential of source node 154 begins to drop with the potential of the drain node 122, the $V_{GS}$ voltage between the control gate 156 and source node 154 increases from a more negative voltage (e.g., −14V) to a less negative voltage (e.g., −13V). When the $V_{GS}$ voltage increases high enough, the HVT 140 becomes conductive. The output voltage of the HVD 100 can be collected from the drain node 122 of the LVT 110 or from the drain node 152 of the HVT 140. By adjusting the switching input voltage at the control gate 128, the output voltage can be controlled. For instance, in some circuit configurations, the output voltage at the drain node 152 can vary between approximately 0V and the supply voltage of the high-voltage source 106.

The HVD 110 includes several wiring options for connecting the LVT 110 and HVT 140 with each other and with one or more external power sources (e.g., 106 and 108) and drivers (e.g., 103, 105, 107, and 109). The drain node 152 of the HVT 140 is coupled with the high voltage source 106 via an interconnect 170, a bonding pad 171 for interfacing the HVT 140, and a load 195 (e.g. a resistor, inductor or another transistor). The interconnect 170 is disposed within the HVT 140, whereas the bonding pad 171 is disposed external to the HVT 140. Thus, the parasitic load of the bonding pad 171 is higher than that of the interconnect 170. The load 195 is also disposed external to the HVT 140, and it is used for establishing a load voltage between the high-voltage source 106 and the drain node 152 of the HVT 140 when the HVT 140 becomes conductive.

The control gate 156 and the auxiliary field plate 158 of the HVT 140 are coupled with the low-voltage source 108 via an interconnect 174, a bonding pad 175 for interfacing the HVT 140, a pair of bonding wires 183 and 187, and optionally, a ringing suppressor 193 connecting in series with the pair of bonding wires 183 and 187. The interconnect 174 is disposed within the HVT 140, whereas the bonding pad 175 and bonding wires 183 and 187 are disposed external to the HVT 140. Thus, the parasitic load of the bonding pad 175 and bonding wires 183 and 187 are higher than that of the interconnect 174.

Depending on the particular implementation, the low-voltage source 108 can be a voltage source that supplies a voltage that is lower that the voltage supplied by the high-voltage source 106. As such, the voltage difference between these two sources (i.e., 106 and 108) is sufficient to sustain a saturated current for the HVT 140 and the LVT 110. In one implementation, for instance, the low-voltage source 108 can be an external ground source and the high-voltage source 106 can be an external power source. In another implementation, for instance, the low-voltage source 108 can be a non-ground source that is tied to the drain node of another transistor, whereas the high-voltage source 106 may be tied to the source node of another transistor. As such, the low-voltage source 108 and the high-voltage source 106 may each include one or more passive elements such as a resistor, a capacitor, and an inductor that may be external to the HVD 100. In yet another implementation, the low-voltage source 108 can also be electrically connected to the common substrate 102.

In a cascode configuration, such as the one as shown in FIG. 1, the control gate 156 (as well as the auxiliary field plate 158) of the HVT 140 shares the low-voltage source 108 with the source node 124 of the LVT 140. Effectively, the control gate 156 of the HVT 140 is coupled with the source node 124 of the LVT 110. In order to suppress a ringing effect between the control gate 156 and the source node 124, the ringing suppressor 193 can be applied between bonding wires 183 and 187. The ringing suppressor 193 functions to suppress or attenuate the oscillation between the control gate 156 and the source node 124. In one implementation, the ringing suppressor 193 may include a resistor having a resistance of 20 ohms.

In an alternative configuration, the control gate 156 can be driven directly by a gate voltage for regulating the heterojunction channel on the 2DEG layer 148. The gate voltage is delivered by a HV gate driver 107, which can be disposed either external or internal to the structure (e.g., an IC die) within which the HVT 140 is formed. In a configuration which the HV gate driver 107 is external to the HVT 140 structure, the control gate 156 (as well as the auxiliary field plate 158) is coupled with the HV gate driver 107 via the interconnect 174, the bonding pad 175, and the bonding wire 183. In another configuration which the HV gate driver 107 is internal to the HVT 140 structure, the control gate 156 (as well as the auxiliary field plate 158) is coupled with the HV gate driver 107 via the interconnect 174. In yet another configuration, the gate driver may also be integrated on the same die as the LVT 110, along with other integrated circuitry necessary for the use of the HVD 100 or 200.

Like the control gate 156, the first and second field electrodes (FEs) 162 and 164 of the HVT 140 are coupled with the low-voltage source 108. More specifically, the first FE 162 is coupled with the low-voltage source 108 via an interconnect 176, a bonding pad 177 for interfacing the HVT 140, a pair of bonding wires 182 and 186, and optionally, a ringing suppressor 192 connecting in series with the pair of bonding wires 182 and 186. The interconnect 176 is disposed within the HVT 140, whereas the bonding pad 177 and bonding wires 182 and 186 are disposed external to the HVT 140. Thus, the parasitic load of the bonding pad 177 and bonding wires 182 and 186 are higher than that of the interconnect 176.

In a similar fashion, the second FE 164 is coupled with the low-voltage source 108 via an interconnect 172, a bonding pad 173 for interfacing the HVT 140, a pair of bonding wires 184 and 188, and optionally, a ringing suppressor 194 connecting in series with the pair of bonding wires 184 and 188. The interconnect 172 is disposed within the HVT 140, whereas the bonding pad 173 and bonding wires 184 and 188 are disposed external to the HVT 140. Thus, the parasitic load of the bonding pad 173 and bonding wires 184 and 188 are higher than that of the interconnect 172.

In a cascode configuration, such as the one as shown in FIG. 1, the first and second field electrodes 162 and 164 of the HVT 140 share the low-voltage source 108 with the source node 124 of the LVT 140. Effectively, the first and second field electrodes 162 and 164 of the HVT 140 are coupled with the source node 124 of the LVT 110. In order to suppress a ringing effect between the first field electrode 162 and the source node 124, the ringing suppressor 192 can be applied between bonding wires 182 and 186. The ringing suppressor 192 functions to suppress or attenuate the oscillation between the first field electrode 162 and the source node 124. In one implementation, the ringing suppressor 192 may include a resistor having a resistance of 20 ohms. In an alternative implementation, the ringing suppressor 192 can be of a lower value or removed when there is insignificant amount of ringing between the first field electrode 162 and the source node 124. For a similar purpose, the ringing suppressor 194 can be applied between bonding wires 184 and 188. The ringing suppressor 194 functions to suppress or attenuate the oscillation between the second field electrode 164 and the source node 124. In one implementation, the ringing suppressor 194 may include a resistor having a resistance of 20 ohms. In an alternative implementation, the ringing suppressor 194 can be of a lower value or removed when there is insignificant amount of ringing between the second field electrode 164 and the source node 124.

Like the control gate 156, the first and second field electrodes 162 and 164 can be driven directly by separate field voltages for regulating the heterojunction channel on the 2DEG layer 148. More specifically, the first field electrode 162 can be driven by a first field voltage for spreading mobilized charges in the first region 163 of the 2DEG layer 148, whereas the second field electrode 164 can be driven by a second field voltage for spreading mobilized charges in the second region 165 of the 2DEG layer 148.

The first field voltage is delivered by a first field voltage driver 103, which can be disposed either external or internal to the structure (e.g., an IC die) within which the HVT 140 is formed. In a configuration which the first field voltage driver 103 is external to the HVT 140 structure, the first field electrode 162 is coupled with the first field voltage driver 103 via the interconnect 176, the bonding pad 177, and the bonding wire 182. In another configuration which the first field voltage driver 103 is internal to the HVT 140 structure, the first field electrode 162 is coupled with the first field voltage driver 103 via the interconnect 176.

The second field voltage is delivered by a second field voltage driver 109, which can be disposed either external or internal to the structure (e.g., an IC die) within which the HVT 140 is formed. In a configuration which the second field voltage driver 109 is external to the HVT 140 structure, the second field electrode 164 is coupled with the second field voltage driver 109 via the interconnect 172, the bonding pad 173, and the bonding wire 184. In another configuration which the second field voltage driver 109 is internal to the HVT 140 structure, the second field electrode 164 is coupled with the second field voltage driver 109 via the interconnect 172.

The source node 154 of the HVT 140 is coupled with the drain node 122 of the LVT 110. The source node 154 is coupled to an interconnect 178 within the HVT 140 to reach a bonding pad 179 that interfaces the HVT 140, whereas the drain node 122 is coupled to an interconnect 135 within the LVT 110 for reaching a bonding pad 136 that interfaces the LVT 110. In turns, the bonding pads 179 and 136 are coupled with each other via bonding wires 181 and 185 as well as an optional ringing suppressor 191. In an alternative implementation, the ringing suppressor 191 can be removed when there is insignificant amount of ringing between the source node 154 and the drain node 122.

The control gate 128 of the LVT 110 is coupled to an interconnect 133 within the LVT 110 for reaching a bonding pad 134 that interfaces the LVT 110. The bonding pad 134 is coupled to a low-voltage (LV) gate driver 105. The control gate 128 is configured to receive a LV gate voltage from the LV gate driver 105 for establishing the reversed n-channel defined between the drain region 116 and the source region 114. The LV gate driver 105 can be disposed either external or internal to the structure (e.g., an IC die) within which the LVT 110 is formed. In a configuration which the LV gate driver 105 is internal to the LVT 110 structure, the control gate 128 is coupled with the LV gate driver 105 via the interconnect 133.

The source node 124 of the LVT 110 is coupled with the low voltage source 108 via an interconnect 131, and a bonding pad 132 for interfacing the LVT 110. The interconnect 131 is disposed within the LVT 110, whereas the bonding pad 132 is disposed external to the LVT 110. Thus, the parasitic load of the bonding pad 132 is higher than that of the interconnect 131. In an alternate implementation, the source node 124 may be internally connected to the first substrate 112, and in turn, the first substrate 112, bonding wires 188, 186 and 187 and the low-voltage source 108 are all electrically connected to the common substrate 102. In the cascode configuration as shown in FIG. 1, the control gate 156 (as well as the auxiliary field plate 158) of the HVT 140 shares the low-voltage source 108 with the source node 124 of the LVT 140. Effectively, the control gate 156 of the HVT 140 is coupled with the source node 124 of the LVT 110 via the bonding pad bonding wire 187, bonding pad 132, and interconnect 131.

To minimize the capacitance associated with the control gate 156, the drain node 152, and the source node 154, the corresponding interconnects (e.g., 174, 172, 178), bonding pads (e.g., 175, 171, 179), and bonding wires (e.g., 184, 181) of these electrodes are structurally and electrically isolated from the first and second field electrodes 162 and 164. Thus, the respective interconnects (e.g., 176, 172), bonding pads (e.g., 177, 173), bonding wires (e.g., 182, 184), and ringing suppressor (e.g., 192, 194) of the first and second field electrodes 162 and 164 are likewise isolated from the control gate 156, the drain node 152, and the source node 154. As such, the respective interconnects (e.g., 176, 172), bonding pads (e.g., 177, 173), bonding wires (e.g., 182, 184), and ringing suppressor (e.g., 192, 194) of the first and second field electrodes 162 and 164 are separated and free of contact from the interconnects (e.g., 174, 172, 178), bonding pads (e.g., 175, 171, 179), and bonding wires (e.g., 184, 181) of the control gate 156, the drain node 152, and the source node 154.

Although FIG. 1 shows that the LVT 110 and the HVT 140 are coupled with each other via one or more bonding wires and bonding pads, the LVT 110 and the HVT 140 can be coupled with each other using other means. In one alternative implementation, for example, the HVD 100 can be formed using a flip-chip configuration. The LVT 110 can be formed on a first side of a common silicon substrate, whereas the HVT 140 can be formed on a second side of the common silicon substrate opposing the first side. The LVT 110 can be coupled with the HVT 140 using through-silicon via and interconnect lines. The ringing suppressors may include within the same die in which the LVT 110 and the HVT 140 are formed.

Figure 2:
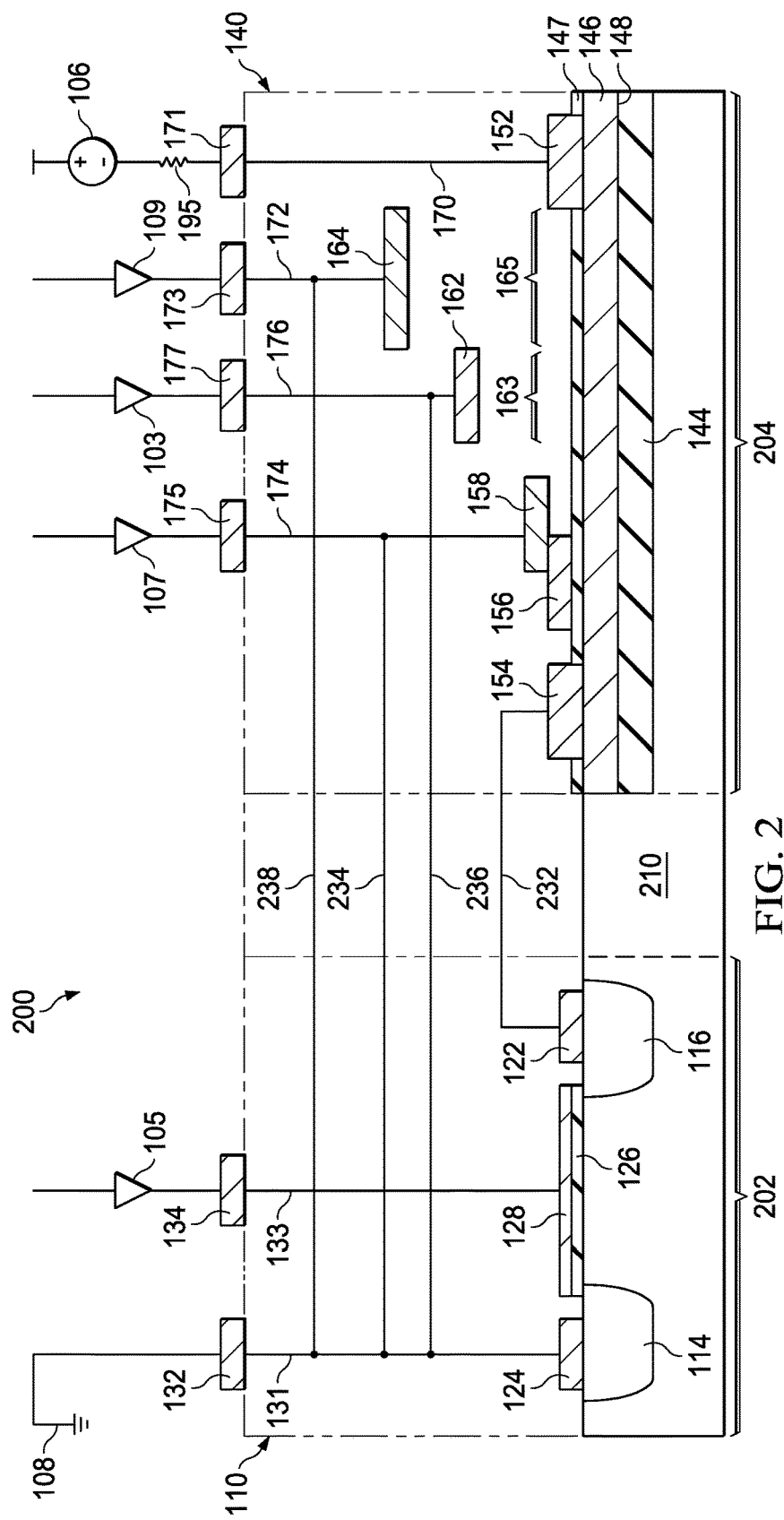
FIG. 2 shows a cross-sectional view of an exemplary high-voltage device formed on a single substrate according to an aspect of the present disclosure.

FIG. 2 shows a cross-sectional view of an exemplary high-voltage device 200 formed on a single substrate 210 according to an aspect of the present disclosure. The high-voltage device (HVD) 200 is similar to the HVD 100 as shown and described in FIG. 1. For instance, the HVD 200 includes the LVT 110 and the HVT 140 both of which are structured and configured in substantially the same way as in the HVD 100. The HVD 200 also includes the same external power sources (e.g., 106 and 108) and drivers (e.g., 103, 105, 106, and 107) as in HVD 100. The HVD 200 is an integrated version of the HVD 100 in that the HVT 140 and the LVT 110 are formed on a single silicon substrate 210 instead of two separate substrates (e.g., 112 and 142) as shown in FIG. 1. In particular, the LVT 110 is formed on a first substrate occupying an LVT region 202 of the common silicon substrate 210, whereas the HVT 140 is formed on a second substrate occupying an HVT region (or a HEMT region when the HVT 110 is a HEMT) 204 of the common silicon substrate 210. The LVT region 202 is separated and distinct from the HVT region 204 such that these two regions do not overlap.

Because the LVT 110 and the HVT 140 are formed on the same substrate 210 from which a single integrated circuit die is fabricated, the connections between the LVT 110 and the HVT 140 do not involve any bonding pad and bonding wire as shown in FIG. 1. The source node 154 of the HVT 140 is coupled with the drain node 122 of the LVT 110 via an interconnect 232. The first field electrode 162 is coupled with the source node 124 via an interconnect 236. The second field electrode 164 is coupled with the source node 124 via an interconnect 238. The control gate 156 and the auxiliary field plate 158 are coupled with the source electrode 124 via an interconnect 234. That way, the first field electrode 162, the second electrode 164, the control gate 156, and the source node 124 share a single bonding pad 132 for accessing the low-voltage source 108. In an alternative implementation, the source 124 of the LVT 110 may be internally connected to the substrate 210, and the low-voltage source 108 may be connected to the backside of the common substrate 210. Although FIG. 2 shows no ringing suppressor, the ringing suppressors as shown in FIG. 1 (e.g., 194, 192, and 193) can be added as an option to interconnect lines 234, 236, and 238. When compared to the HVD 100, the HVD 200 is more compact in size with the potential tradeoff of a more complex fabrication process.

FIG. 3A shows a timing diagram comparing turn-on performances between a conventional high-voltage device and a disclosed high-voltage device according to several simulation results. The disclosed high-voltage device includes the HVD 100 as shown and described in FIG. 1. The conventional high-voltage device can be a high-voltage device including a HEMT that has no isolated field electrode. That is, all the heterojunction regulation charge spreading means of the conventional high-voltage device are connected to the control gate of the HEMT. Unlike the charge spreading means (e.g., the first and second field electrodes 162 and 164) of the HVD 100, the charge spreading means of the conventional high-voltage device makes contact with the control gate and thus share charges with the control gate. As a result, the charge spreading means of the conventional high-voltage device increases the control gate related capacitances, which contribute to a greater switching time and larger power loss during switching.

Waveform 302 depicts the transient $V_{DS}$ voltage of the conventional high-voltage device during a turn-on transition. Waveform 304 depicts the transient $V_{DS}$ voltage of the disclosed high-voltage device (i.e., the potential difference between the drain node 152 and the source node 124 of the HVD 100) during a turn-on transition. Comparing waveform 302 with waveform 304, it is evident that the turn-on transition of the disclosed high-voltage device is significantly faster than the conventional high-voltage device. Corroborating with waveforms 302 and 304, waveform 306 depicts the transient current $I_D$ of the conventional high-voltage device, and waveform 308 depicts the transient current $I_D$ of the disclosed high-voltage device. Comparing waveform 306 with waveform 308, it is evident that during a turn-on transition, the transient current $I_D$ of the disclosed high-voltage device reaches its saturation level much faster than the conventional high-voltage device.

FIG. 3B shows a timing diagram comparing turn-off performances between a conventional high-voltage device and a disclosed high-voltage device according to several simulation results. The disclosed high-voltage device includes the HVD 100 as shown and described in FIG. 1. The conventional high-voltage device can be a high-voltage device including a HEMT that has no isolated field electrode. That is, all the heterojunction regulation charge spreading means of the conventional high-voltage device are connected to the control gate of the HEMT. Unlike the charge spreading means (e.g., the first and second field electrodes 162 and 164) of the HVD 100, the charge spreading means of the conventional high-voltage device makes contact with the control gate and thus share charges with the control gate. As a result, the charge spreading means of the conventional high-voltage device increases the control gate related capacitances, which contribute to a greater switching time and larger power loss during switching.

Waveform 312 depicts the transient $V_{DS}$ voltage of the conventional high-voltage device during a turn-off transition. Waveform 314 depicts the transient VDS voltage of the disclosed high-voltage device (e.g., the potential difference between the drain node 152 and the source node 124 of the HVD 100) during a turn-off transition. Comparing waveform 312 with waveform 314, it is evident that the turn-off transition of the disclosed high-voltage device is significantly faster than the conventional high-voltage device. Corroborating with waveforms 312 and 314, waveform 316 depicts the transient current $I_D$ of the conventional high-voltage device, and waveform 318 depicts the transient current $I_D$ of the disclosed high-voltage device. Comparing waveform 316 with waveform 318, it is evident that during a turn-off transition, the transient current $I_D$ of the disclosed high-voltage device is cut off at a much faster rate than the conventional high-voltage device.

Figure 4:
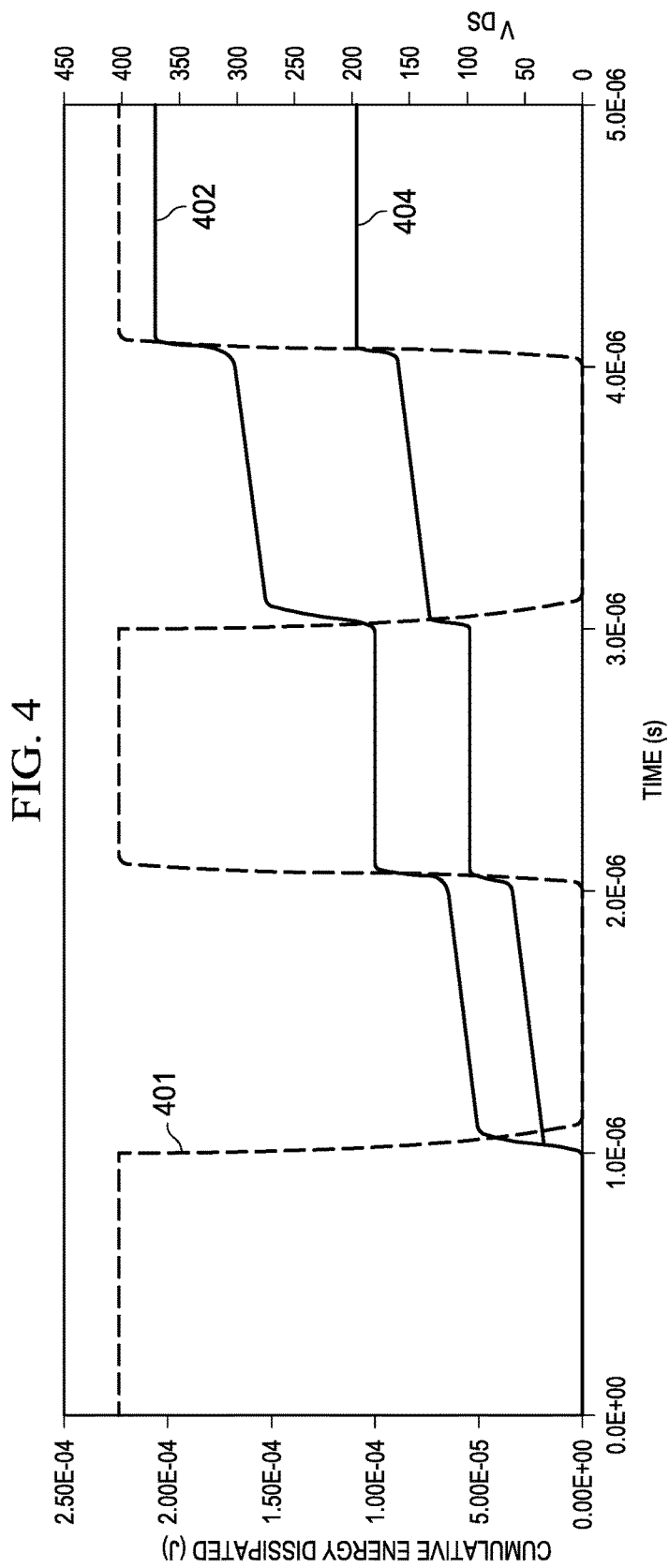
FIG. 4 shows a timing diagram comparing switching power losses between a conventional high-voltage device and a disclosed high-voltage device according to an aspect of the present disclosure.

FIG. 4 shows a timing diagram comparing switching power losses between the conventional high-voltage device and the disclosed high-voltage device according to the simulation results as described in FIGS. 3A and 3B. Dotted waveform 401 represents the transient drain-source voltage ($V_{DS}$) common to both the conventional high-voltage device and the disclosed high-voltage device (e.g., the voltage between the nodes 171 and 132 of the HVD 100). When the dotted waveform 401 transits from a high level to a low level, both devices are configured to turn-on. In contrast, when the dotted waveform 402 transits from a low level to a high level, both devices are configured to turn-off.

Waveform 402 depicts the power consumption of the conventional high-voltage device throughout several switching cycles. Waveform 404 depicts the power consumption of the disclosed high-voltage device throughout the same switching cycles. Comparing waveform 402 with waveform 404, it is evident that the disclosed high-voltage device sustains a significantly smaller power loss than the conventional high-voltage device during each switching transition (i.e., both turn-on and turn-off transitions). This is due to the fact that the disclosed high-voltage device has a faster switching time and consumes a smaller amount of switching current (e.g., FIGS. 3A and 3B).

A few embodiments have been described in detail above, and various modifications are possible. The disclosed subject matter, including the functional operations described in this specification, can be implemented in electronic circuitry, computer hardware, firmware, software, or in combinations of them, such as the structural means disclosed in this specification and structural equivalents thereof, including potentially a program operable to cause one or more data processing apparatus to perform the methods and/or operations described (such as a program encoded in a computer-readable medium, which can be a memory device, a storage device, a machine-readable storage substrate, or other physical, machine-readable medium, or a combination of one or more of them).

Consistent with the present disclosure, the term "configured to" purports to describe the structural and functional characteristics of one or more tangible non-transitory components. For example, the term "configured to" can be understood as having a particular configuration that is designed or dedicated for performing a certain function. Within this understanding, a device is "configured to" perform a certain function if such a device includes tangible non-transitory components that can be enabled, activated, or powered to perform that certain function. While the term "configured to" may encompass the notion of being configurable, this term should not be limited to such a narrow definition. Thus, when used for describing a device, the term "configured to" does not require the described device to be configurable at any given point of time.

While this specification contains many specifics, these should not be construed as limitations on the scope of what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results unless such order is recited in one or more claims. In certain circumstances, multitasking and parallel processing may be advantageous. Moreover, the separation of various system components in the embodiments described above should not be understood as requiring such separation in all embodiments.

What is claimed is:

1. A high-voltage device, comprising:
   a low-voltage transistor (LVT) having a first drain node, a first control gate, and a first source node;
   a high electron mobility transistor (HEMT) having a second drain node, a second source node, a second control gate, and a field electrode free of being electrically coupled to the second control gate and the second source node within the HEMT;
   a first conductor external to the HEMT and the LVT, and coupling the field electrode of the HEMT to the first source node of the LVT; and
   a second conductor external to the HEMT and the LVT, and coupling the second control gate of the HEMT to the first source node of the LVT.

2. The high-voltage device of claim 1, further comprising:
   a first die including the LVT; and
   a second die separated from the first die, the second die including the HEMT.

3. The high-voltage device of claim 1, wherein the field electrode is insulated from the second control gate and the second source node within the HEMT.

4. The high-voltage device of claim 1, wherein the first conductor includes a first bonding wire, and the second conductor includes a second bonding wire.

5. The high-voltage device of claim 1, wherein:
   the LVT is formed on a first substrate;
   the HEMT is formed on a second substrate separated from the first substrate; and
   the HEMT includes:
      a 2-dimension electron gas (2DEG) layer disposed above the second substrate;
      the second drain node disposed above the 2DEG layer;
      the second source node disposed above the 2DEG layer, and connected with the first drain node of the LVT; and
      the second control gate disposed above the 2DEG layer.

6. The high-voltage device of claim 5, wherein:
   the second control gate is configured to regulate a channel defined jointly by the second drain node, the second source node, and the 2DEG layer; and
   the field electrode is configured to distribute charges along the channel.

7. The high-voltage device of claim 5, wherein the field electrode is positioned farther away from the 2DEG layer than the second control gate.

8. The high-voltage device of claim 1, further comprising:
   a first bonding pad connected with the field electrode of the HEMT;
   a second bonding pad separated from the first bonding pad, and connected with the second control gate of the HEMT; and
   a third bonding pad separated from the first bonding pad, and connected with the second source node of the HEMT.

9. The high-voltage device of claim 1, wherein:
   the field electrode of the HEMT is connected to the first source node of the LVT via a first ringing suppressor in series with the first conductor; and
   the second control gate of the HEMT is connected to the first source node of the LVT via a second ringing suppressor in series with the second conductor.

10. The high-voltage device of claim 1, wherein:
    the second drain node is configured to receive a high-voltage source; and
    the first source node of the LVT is configured to receive a source voltage.

11. A device, comprising:
    a first die having a MOS transistor including a first drain node, a first control gate, and a first source node;
    a second die separated from the first die, and having a gallium nitride (GaN) transistor including a second drain node, a second source node, a second control gate, and a field electrode insulated from the second control gate and the second source node within the GaN transistor;
    a first conductor external to the first die and the second die, and coupling the field electrode of the GaN transistor to the first source node of the MOS transistor; and
    a second conductor external to the first die and the second die, and coupling the second control gate of the GaN transistor to the first source node of the MOS transistor.

12. The device of claim 11, wherein the first conductor includes a first bonding wire, and the second conductor includes a second bonding wire.

13. The device of claim 11, wherein the GaN transistor includes
    a 2-dimension electron gas (2DEG) layer;
    the second drain node disposed above the 2DEG layer;
    the second source node disposed above the 2DEG layer, and connected with the first drain node of the MOS transistor; and
    the second control gate disposed above the 2DEG layer.

14. The device of claim 11, further comprising:
    a first bonding pad connected with the field electrode of the GaN transistor;
    a second bonding pad separated from the first bonding pad, and connected with the second control gate of the GaN transistor; and
    a third bonding pad separated from the first bonding pad, and connected with the second source node of the GaN transistor.

15. The device of claim 11, wherein: the field electrode of the GaN transistor is connected to the first source node of the MOS transistor via a first ringing suppressor in series with the first conductor; and the second control gate of the GaN transistor is connected to the first source node of the MOS transistor via a second ringing suppressor in series with the second semiconductor.

* * * * *